(12) United States Patent
Mimura et al.

(10) Patent No.: US 7,212,080 B2
(45) Date of Patent: May 1, 2007

(54) SURFACE ACOUSTIC WAVE DEVICE HAVING TWO PIEZOELECTRIC SUBSTRATES WITH DIFFERENT CUT ANGLES

(75) Inventors: Masakazu Mimura, Ritto (JP); Tomohisa Komura, Yasu (JP); Norio Taniguchi, Otsu (JP); Takeshi Nakao, Omihachiman (JP); Michio Kadota, Kyoto (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 11/531,003

(22) Filed: Sep. 12, 2006

(65) Prior Publication Data

US 2007/0013459 A1 Jan. 18, 2007

Related U.S. Application Data (63) Continuation of application No. PCT/JP2005/003519, filed on Mar. 2, 2005.

(30) Foreign Application Priority Data

Mar. 12, 2004 (JP) ............................. 2004-071153

(51) Int. Cl.
H03H 9/72 (2006.01)
H03H 9/64 (2006.01)
(52) U.S. Cl. .................... 333/133; 333/193; 310/313 A
(58) Field of Classification Search ................. 333/133, 333/193; 310/313 A
See application file for complete search history.

(56) References Cited

U.S. PATENT DOCUMENTS 5,654,680 A 8/1997 Kwan et al.
6,037,847 A 3/2000 Ueda et al.
6,861,924 B2 * 3/2005 Machui ....................... 333/133
2004/0164644 A1 8/2004 Nishiyama et al.

FOREIGN PATENT DOCUMENTS

| EP | 1 391 988 A2 | 2/2004 |
|----|----|----|
| JP | 04-369111 A | 12/1992 |
| JP | 07-283688 A | 10/1995 |
| JP | 09-167936 A | 6/1997 |
| JP | 09-214285 A | 8/1997 |
| JP | 10-126208 A | 5/1998 |
| JP | 2003-517239 A | 5/2003 |
| JP | 2004-112748 A | 4/2004 |
| JP | 2004-165879 A | 6/2004 |

OTHER PUBLICATIONS

International Search Report issued in the corresponding International Application No. PCT/JP2005/003519, mailed on Jun. 21, 2005.
Sato et al., "Optimum Cut for Rotated Y-Cut LiNbO3 Crystals Used as the Substrate of Elastic Surface Wave Filters," The Journal of the Acoustical Society of Japan, vol. 30, No. 10, Oct. 1974, pp. 549-556.

* cited by examiner

Primary Examiner—Barbara Summons
(74) Attorney, Agent, or Firm—Keating & Bennett, LLP

(57) ABSTRACT

A surface acoustic wave branching filter includes a first filter and a second filter each including a plurality of surface acoustic wave resonators arranged in a ladder circuit configuration. The first filter in which the frequency range of the passband is relatively low is provided on a first piezoelectric substrate, and the second filter in which the frequency range of the passband is relatively high is provided on a second piezoelectric substrate. The first piezoelectric substrate and the second piezoelectric substrate are rotation Y-cut X-propagation $LiTaO_3$ substrates, and the cut angle of the first piezoelectric substrate is greater than the cut angle of the second piezoelectric substrate.

8 Claims, 8 Drawing Sheets

SURFACE ACOUSTIC WAVE DEVICE HAVING TWO PIEZOELECTRIC SUBSTRATES WITH DIFFERENT CUT ANGLES

BACKGROUND OF THE INVENTION

1. Field of the Invention

The present invention relates to a surface acoustic wave device in which a first filter having a relatively low passband and a second filter having a relatively high passband are connected, and more specifically, to a surface acoustic wave device in which the first filter is provided on a first piezoelectric substrate and the second filter is provided on a second piezoelectric substrate, which is different from the first piezoelectric substrate.

2. Description of the Related Art

Recently, the size of a branching filter used in cell phones or other electronic equipment is decreasing. In order to decrease the size of such a branching filter, a surface acoustic wave filter including a plurality of surface acoustic wave resonators has been used.

In a branching filter, for example, a transmission-side filter having a relatively low passband and, for example, a reception-side filter having a relatively high passband are connected. In this case, when the passbands of both filters are close to each other, the steepness of the filter characteristic must be increased at the high-frequency side of the passband of the filter having the low passband. In addition, the steepness of the filter characteristic must be increased at the low-frequency side of the passband of the other filter having the high passband.

Japanese Unexamined Patent Application Publication No. 4-369111 (Patent Document 1) discloses an example of a surface acoustic wave branching filter used for such an application.

Figure 12:
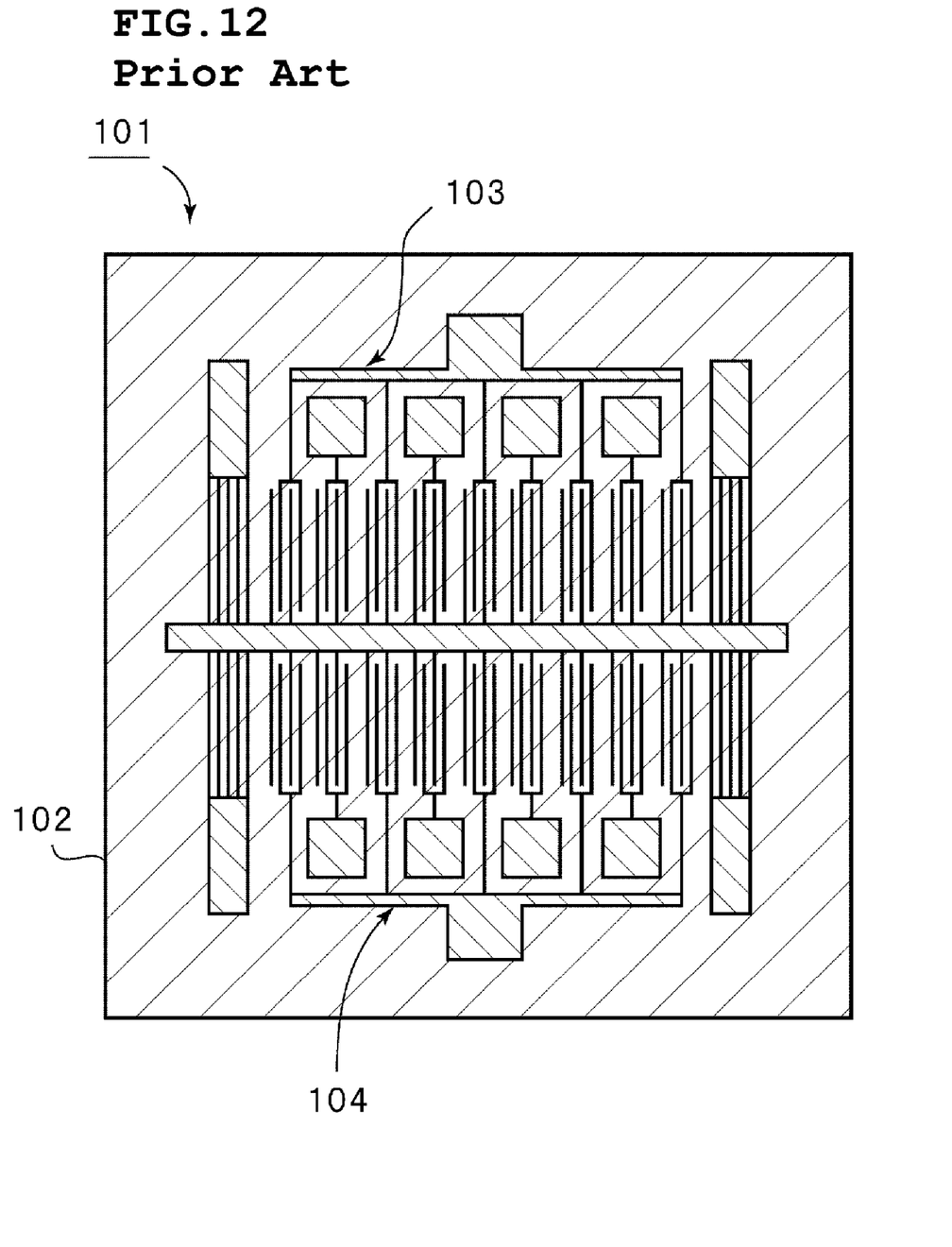
FIG. 12 is a schematic plan view showing an example of a known surface acoustic wave branching filter.

FIG. 12 is a schematic plan view showing the surface acoustic wave branching filter described in Patent Document 1.

In a surface acoustic wave branching filter 101 shown in FIG. 12, in order to reduce the size and the cost thereof, a first filter 103 and a second filter 104 are provided on the same piezoelectric substrate 102. That is, the first filter 103 having a relatively low passband is provided by forming electrodes defining a plurality of surface acoustic wave resonators on the piezoelectric substrate 102. Similarly, the second filter 104 having a relatively high passband is provided by forming electrodes defining a plurality of surface acoustic wave resonators on the piezoelectric substrate 102.

Patent Document 1 also discloses a structure in which the first filter and the second filter that have different passbands are provided on different piezoelectric substrates.

However, Patent Document 1 does not describe the type of piezoelectric substrates that are used when the first filter in which the frequency range of the passband is relatively low and the second filter in which the frequency range of the passband is relatively high are provided on separate piezoelectric substrates.

As described in Patent Document 1, a structure in which a transmission-side filter and a reception-side filter are provided on the same piezoelectric substrate and a structure in which the transmission-side filter and the reception-side filter are provided on different piezoelectric substrates are known. In such a surface acoustic wave branching filter, a piezoelectric substrate having a cut angle at which the propagation attenuation factor has a minimum value is primarily used. When the transmission-side filter and the reception-side filter are provided on separate piezoelectric substrates, two piezoelectric substrates made of the same material having a cut angle at which the propagation attenuation factor has a minimum value are typically used.

However, in the structure in which the transmission-side filter and the reception-side filter are provided on the two piezoelectric substrates made of the same material, when the structure is used in, for example, a branching filter in which the passband of the transmission-side filter and the passband of the reception-side filter are close to each other, the steepness of the filter characteristic is not sufficient and it is difficult to achieve a satisfactory frequency characteristic.

SUMMARY OF THE INVENTION

To overcome the problems described above, preferred embodiments of the present invention provide a surface acoustic wave device in which the steepness of the filter characteristic at the high-frequency side of the passband of a first filter having a relatively low frequency range and the steepness of the filter characteristic at the low-frequency side of the passband of a second filter having a relatively high passband are effectively increased, and even when the surface acoustic wave device is used in an application in which the passbands are close to each other, a satisfactory frequency characteristic is obtained.

A preferred embodiment of the present invention provides a surface acoustic wave device including a first filter in which a plurality of surface acoustic wave resonators are connected so as to have a ladder circuit configuration on a first piezoelectric substrate and the frequency range of the passband is relatively low, and a second filter in which a plurality of surface acoustic wave resonators are connected so as to have a ladder circuit configuration on a second piezoelectric substrate and the frequency range of the passband is relatively high, wherein the first piezoelectric substrate and the second piezoelectric substrate are rotation Y-cut X-propagation $LiTaO_3$ substrates, and the cut angle of the first piezoelectric substrate is greater than the cut angle of the second piezoelectric substrate.

The first piezoelectric substrate is preferably made of a rotation Y-cut X-propagation $LiTaO_3$ substrate having a cut angle of at least about 45°, and the second piezoelectric substrate is preferably made of a rotation Y-cut X-propagation $LiTaO_3$ substrate having a cut angle of less than about 45°.

In the surface acoustic wave device according to preferred embodiments of the present invention, the first and second filters preferably include first and second electrodes provided on the first and second piezoelectric substrates, respectively, and when the densities of the first and second electrodes are represented by $\rho 1$ and $\rho 2$ (g/cm$^3$), respectively, and the wavelengths of the first and second filters are represented by $\lambda 1$ and $\lambda 2$ (μm), respectively, the film thickness of the first electrode is preferably in the range of about $0.18 \times \lambda 1/\rho 1$ to about $0.40 \times \lambda 1/\rho 1$, and the film thickness of the second electrode is preferably in the range of about $0.27 \times \lambda 2/\rho 2$ to about $0.53 \times \lambda 2/\rho 2$.

The first electrode and the second electrode are preferably made of Cu, the thickness of the first electrode is preferably in the range of about $0.02\lambda 1$ to about $0.045\lambda 1$, and the thickness of the second electrode is preferably in the range of about $0.03\lambda 2$ to about $0.06\lambda 2$.

In the surface acoustic wave device according to preferred embodiments of the present invention, a $SiO_2$ film for improving the temperature-dependent characteristic is preferably provided on each of the first piezoelectric substrate and the second piezoelectric substrate.

The thickness of the $SiO_2$ film is preferably in the range of about 5% to about 50% of the wavelengths of the first filter and the second filter.

The top surface of the $SiO_2$ film is preferably planarized.

The surface acoustic wave device according to preferred embodiments of the present invention is suitably used as, for example, a duplexer.

In the surface acoustic wave device according to preferred embodiments of the present invention, a rotation Y-cut X-propagation $LiTaO_3$ substrate is used as the first piezoelectric substrate of the first filter having a relatively low passband, and a rotation Y-cut X-propagation $LiTaO_3$ substrate is also used as the second piezoelectric substrate of the second filter having a relatively high passband. Since the $LiTaO_3$ substrate has a large electromechanical coefficient, a low-loss surface acoustic wave device is provided according to a preferred embodiment of the present invention.

Furthermore, since the cut angle of the first piezoelectric substrate is greater than the cut angle of the second piezoelectric substrate, the steepness of the filter characteristic of the first filter and the second filter is effectively increased. In particular, when the cut angle of the first piezoelectric substrate is at least about 45°, the anti-resonance Q of a surface acoustic wave resonator defining the first filter is greater than the resonance Q thereof, and the steepness at the high-frequency side of the passband of the first filter is effectively increased. When the cut angle of the second piezoelectric substrate is less than about 45°, the resonance Q of a surface acoustic wave resonator defining the second filter is greater than the anti-resonance Q thereof, and the steepness at the low-frequency side of the passband of the second filter is effectively increased.

When the thickness of the electrode of the first filter is in the range of about $0.18 \times \lambda 1/\rho 1$ to about $0.40 \times \lambda 1/\rho 1$, and the thickness of the electrode of the second filter is in the range of about $0.27 \times \lambda 2/\rho 2$ to about $0.53 \times \lambda 2/\rho 2$, the anti-resonance Q of the surface acoustic wave resonator in the first filter is effectively increased and the resonance Q of the surface acoustic wave resonator in the second filter is effectively increased. Accordingly, a greatly improved frequency characteristic is obtained.

In preferred embodiments of the present invention, when a $SiO_2$ film is provided on each of the first and second piezoelectric substrates, the temperature-dependent frequency characteristic of the device is improved by the formation of the $SiO_2$ film. In particular, when the thickness of the $SiO_2$ film is in the range of about 5% to about 50% of the wavelength, the temperature coefficient of resonant frequency is more effectively improved.

When the top surface of the $SiO_2$ film is planarized, undesired ripples or other disturbances in the passband are suppressed, as compared to the case in which the $SiO_2$ film is provided so that the top surface thereof has irregularities that reflect the electrode structure. Thus, an improved frequency characteristic is obtained.

Other features, elements, steps, characteristics and advantages of the present invention will become more apparent from the following detailed description of preferred embodiments of the present invention with reference to the attached drawings.

DETAILED DESCRIPTION OF PREFERRED EMBODIMENTS

Specific preferred embodiments of the present invention will now be described with reference to the attached drawings, thereby clarifying the present invention.

Figure 1A:
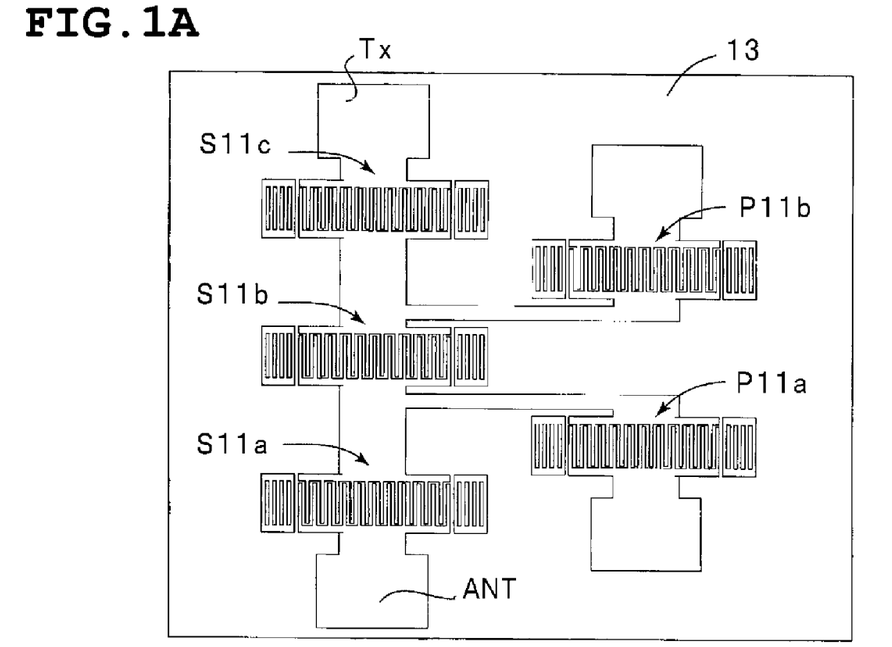
FIGS. 1A and 1B are schematic plan views of a first filter and a second filter, respectively, of a surface acoustic wave branching filter according to a preferred embodiment of the present invention.
Figure 1B:
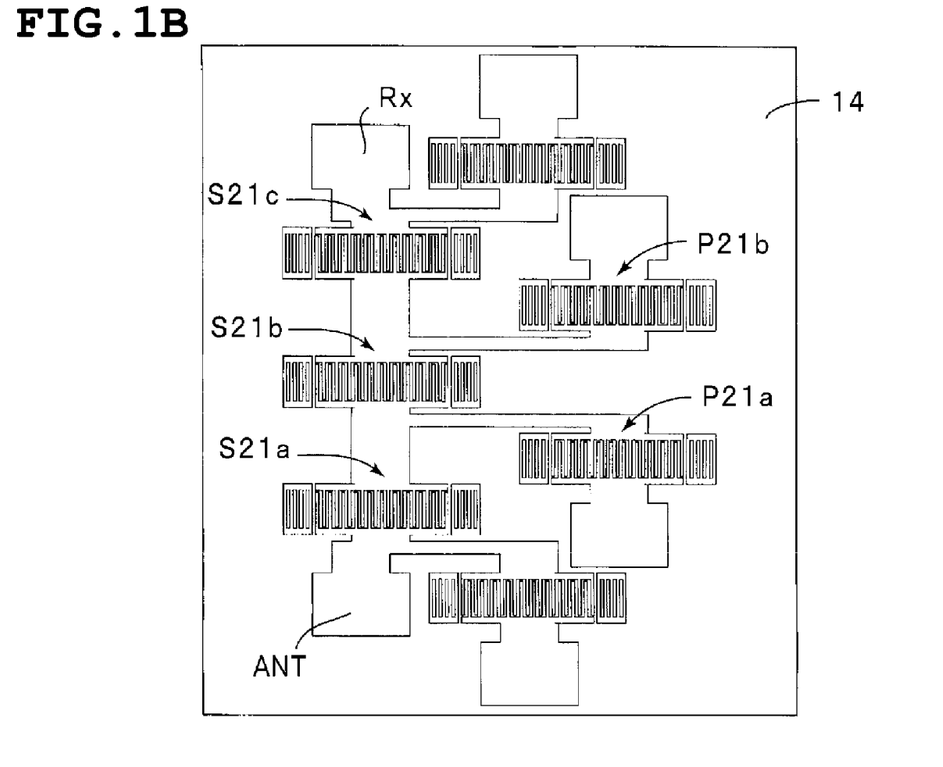
Figure 2:
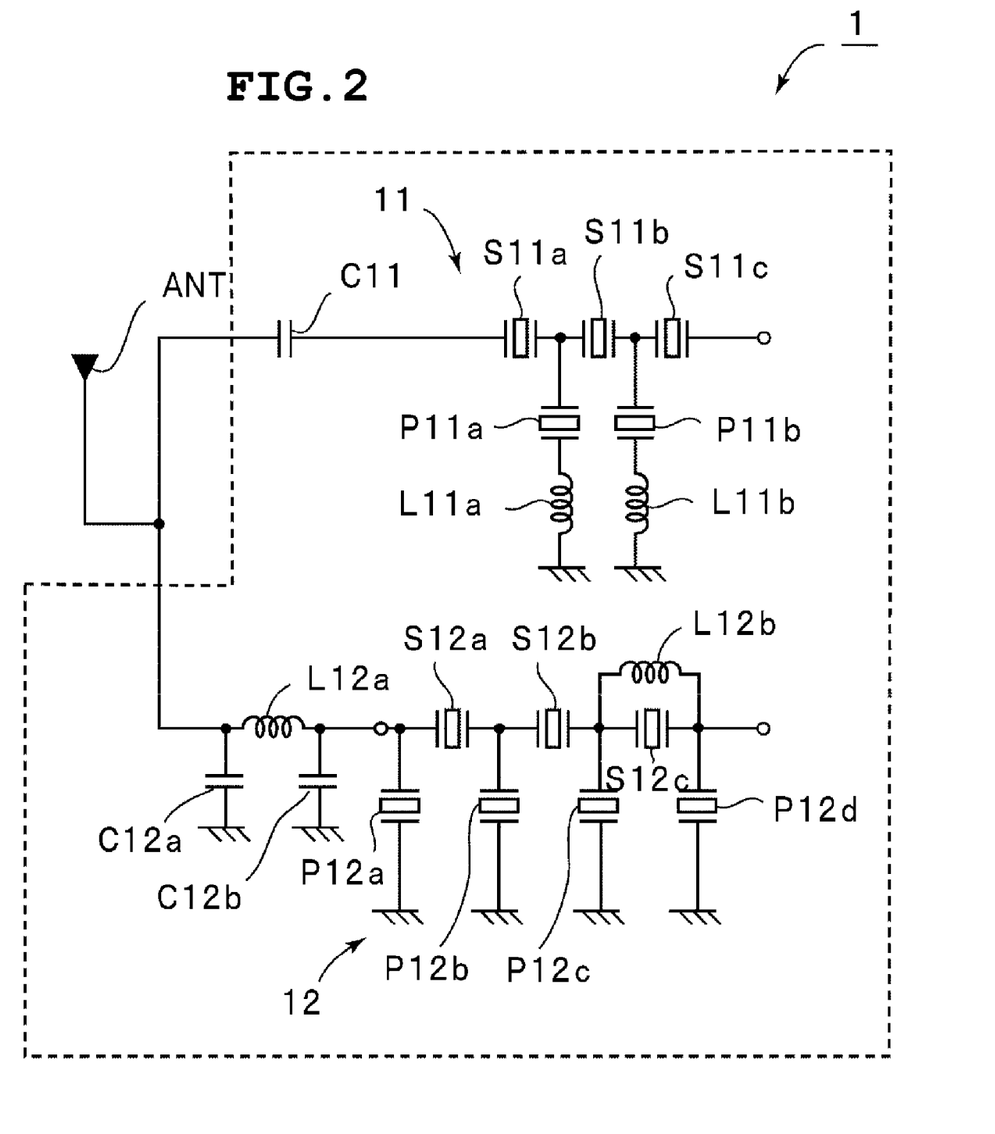
FIG. 2 is a circuit diagram showing the circuit configuration of the surface acoustic wave branching filter according to the preferred embodiment of the present invention.

FIGS. 1A and 1B, respectively, are first and second schematic plan views used in a surface acoustic wave branching filter according to a preferred embodiment of the present invention. FIG. 2 is a diagram showing the circuit configuration thereof.

A surface acoustic wave branching filter 1 of this preferred embodiment is a duplexer for PCS. In the case of PCS, the passband of the transmission side is in the range of 1,850 to 1,910 MHz, and the passband of the reception side is in the range of 1,930 to 1,990 MHz. Consequently, in the surface acoustic wave branching filter 1, a first filter 11 at the transmission side has the passband of the transmission side in the range of 1,850 to 1,910 MHz, and a second filter 12 at the reception side has a passband of the reception side in the range of 1,930 to 1,990 MHz.

As shown in FIG. 2, each of the first filter 11 and the second filter 12 includes a plurality of surface acoustic wave resonators that are connected so as to have a ladder circuit configuration. In this preferred embodiment, the first filter 11 includes series-arm resonators S11a, S11b and S11c, and parallel-arm resonators P11a and P11b. The second filter 12 includes series-arm resonators S12a, S12b and S12c and parallel-arm resonators P12a, P12b, P12c, and P12d.

In the first filter 11, an inductance L11a is connected between the parallel-arm resonator P11a and the ground potential, and an inductance L11b is connected between the parallel-arm resonator P11b and the ground potential. A capacitor C11 is connected between an antenna input terminal ANT and the series-arm resonator S11a. On the other hand, in the second filter 12, a matching circuit is connected between the antenna input terminal ANT and the input terminal of the second filter 12 so as to perform impedance-matching. The matching circuit includes an inductance element L12a disposed between the antenna input terminal ANT and the second filter 12, and capacitor elements C12a and C12b connected between both ends of the inductance element L12a and the ground potential. An inductance element L12b is connected to the series-arm resonator S12c in parallel.

As shown in FIGS. 1A and 1B, the series-arm resonators S11a to S11c, the parallel-arm resonators P11a and P11b, the series-arm resonators S12a to S12c, and the parallel-arm resonators P12a to P12d are defined by 1-port surface acoustic wave resonators each including interdigital electrodes and reflectors disposed on both sides of the interdigital electrodes in the direction of the propagation of surface acoustic waves.

In this preferred embodiment, the first filter 11 is provided on a first piezoelectric substrate 13. That is, various electrodes are arranged on the first piezoelectric substrate 13 to provide the circuit configuration of the first filter 11 shown in FIG. 2. On the other hand, the second filter 12 is provided on a second piezoelectric substrate 14. Various electrodes are arranged on the second piezoelectric substrate 14 to provide the circuit configuration of the second filter 12 shown in FIG. 2.

In the surface acoustic wave branching filter 1 of this preferred embodiment, a piezoelectric substrate in which the anti-resonance Q of a surface acoustic wave resonator used in the first filter 11 is greater than the resonance Q of the surface acoustic wave resonator is used as the first piezoelectric substrate 13, and a piezoelectric substrate in which the resonance Q of a surface acoustic wave resonator used in the second filter 12 is greater than the anti-resonance Q of the surface acoustic wave resonator is used as the second piezoelectric substrate 14. Thereby, the steepness of the filter characteristic at the high-frequency side of the passband of the first filter and the steepness of the filter characteristic at the low-frequency side of the passband of the second filter are increased as described below.

Figure 3:
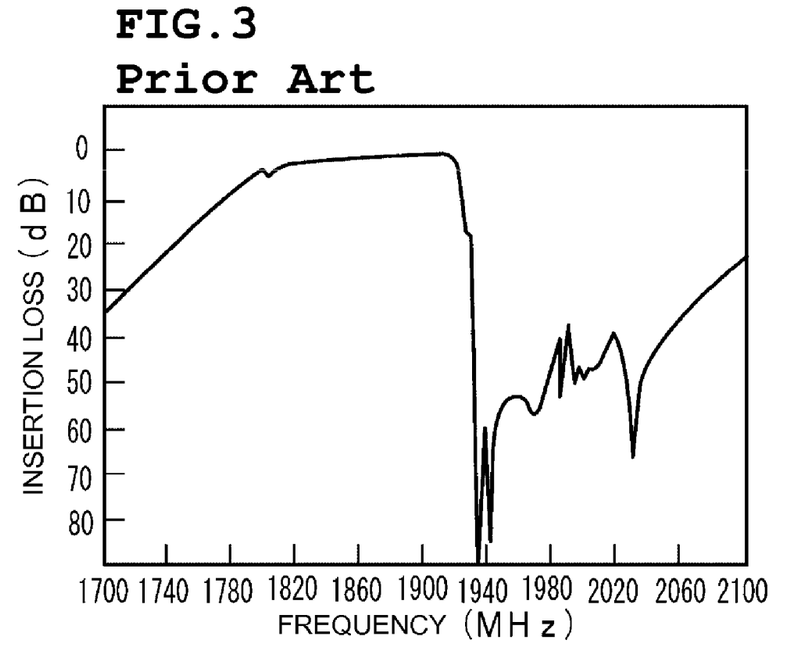
FIG. 3 is a graph showing an example of a known representative frequency characteristic of a transmission-side filter in a surface acoustic wave duplexer for PCS.
Figure 4:
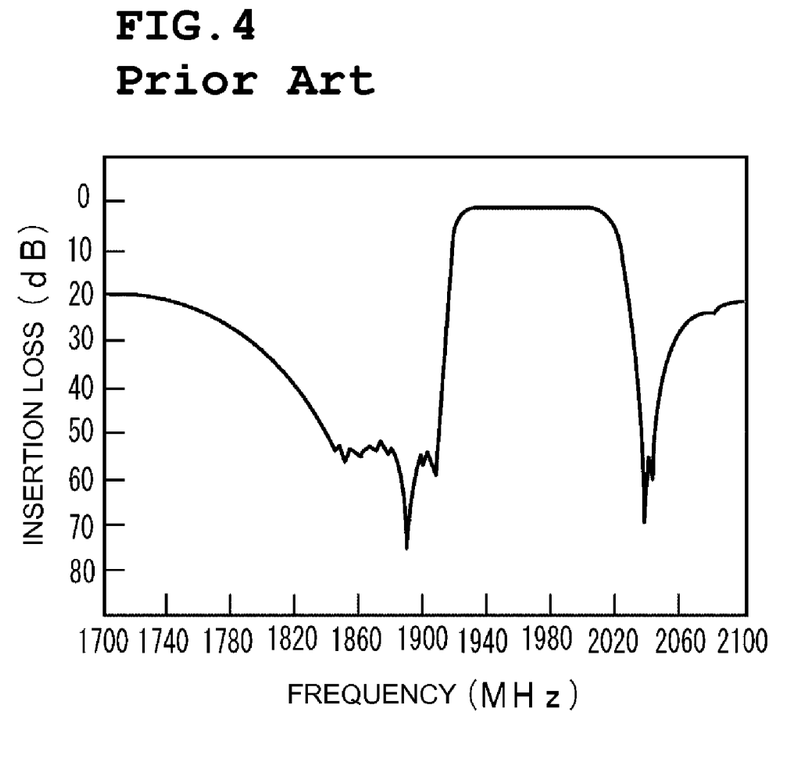
FIG. 4 is a graph showing an example of a known representative frequency characteristic of a reception-side filter in the surface acoustic wave duplexer for PCS.

FIGS. 3 and 4 show representative examples of the frequency characteristics of a transmission filter and a reception filter for general PCS, respectively. With PCS, the frequency interval between the passband of the transmission side and the passband of the reception side is very narrow, i.e., 20 MHz. The transmission-side filter must have sufficient attenuation in the band ranging from 1,930 to 1,990 MHz. The reception-side filter must have sufficient attenuation in the band ranging from 1,850 to 1,910 MHz. Accordingly, in the transmission-side filter, it is desired that the steepness of the filter characteristic be effectively increased at the high-frequency side of the passband, that is, in the area indicated by arrow A in FIG. 3. In the reception-side filter, it is desired that the steepness of the filter characteristic be effectively increased at the low-frequency side of the passband, that is, in the area indicated by arrow B in FIG. 4. In the surface acoustic wave branching filter 1 of this preferred embodiment, these requirements are satisfied as described below.

Figure 5:
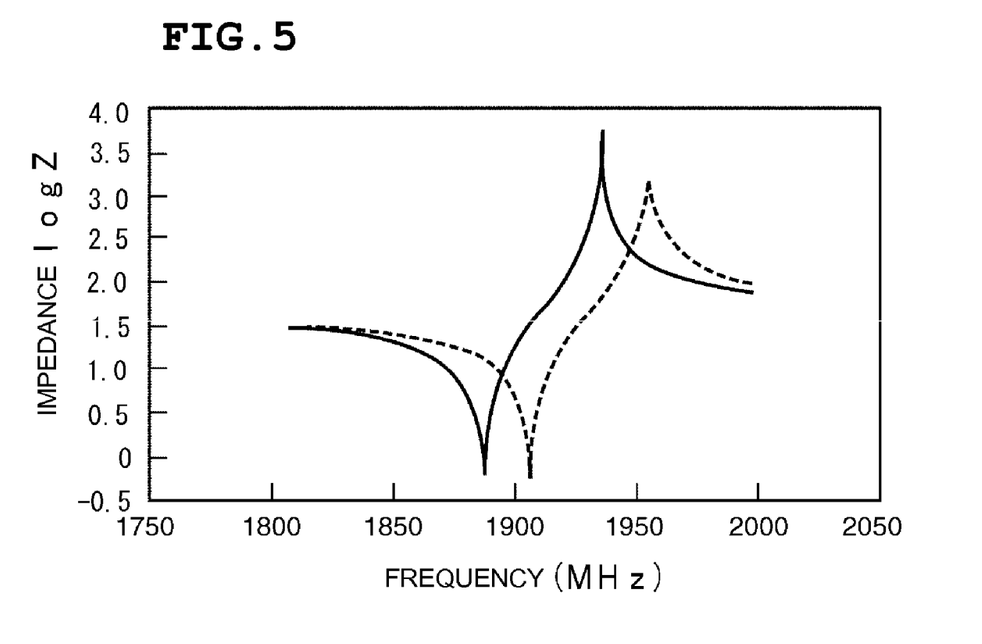
FIG. 5 is a graph showing the relationship between the impedance and the frequency characteristic of 1-port surface acoustic wave resonators.
Figure 6:
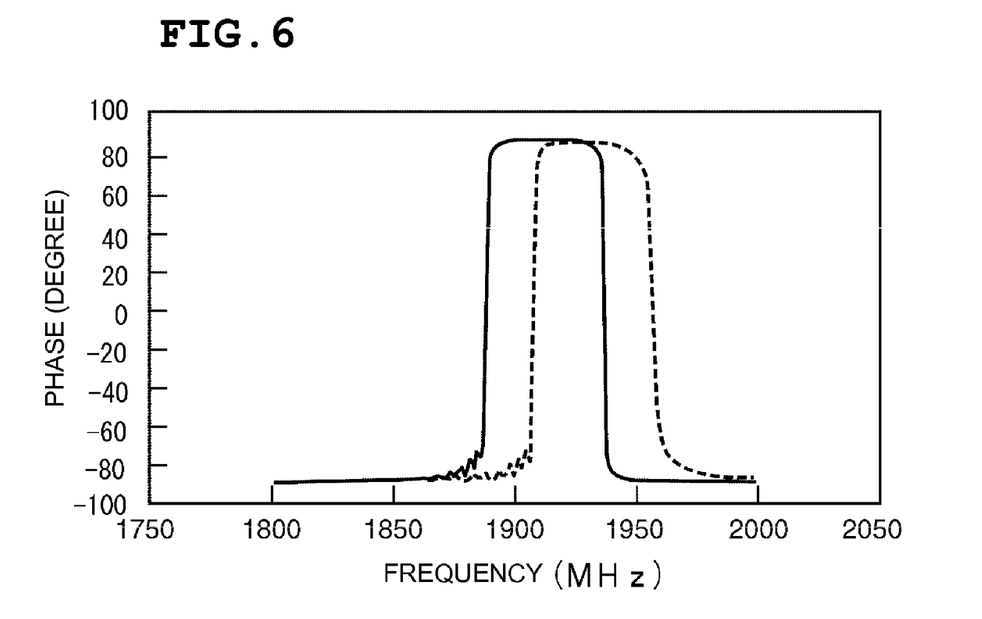
FIG. 6 is a graph showing the relationship between the phase and the frequency characteristic of the 1-port surface acoustic wave resonators.
Figure 7:
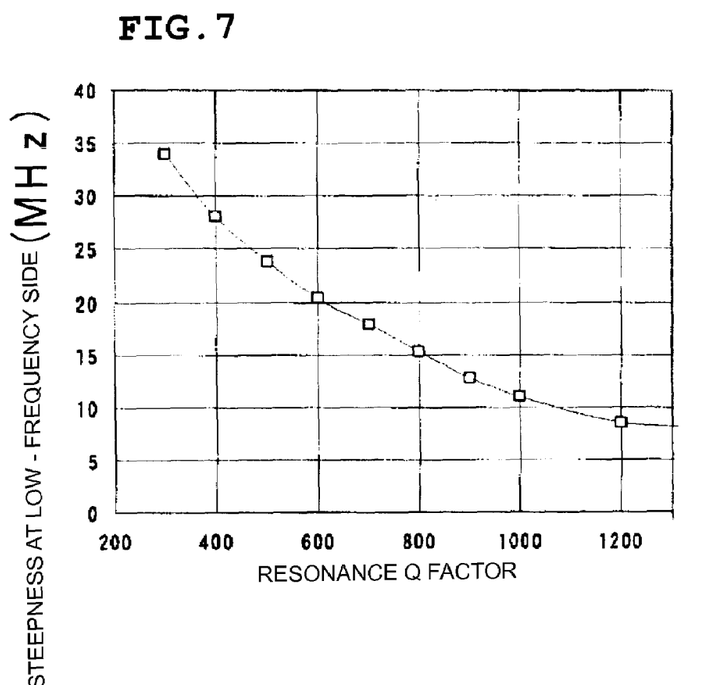
FIG. 7 is a graph showing the relationship between the resonance Q factor of a 1-port surface acoustic wave resonator and the steepness of the filter characteristic at frequencies lower than the passband of a ladder filter.

FIGS. 5 and 6 are graphs showing examples of representative impedance characteristics and phase characteristics of two types of 1-port surface acoustic wave resonator. FIG. 7 is a graph showing the relationship between the resonance Q factor of a surface acoustic wave resonator and the steepness of the filter characteristic at the low-frequency side of the passband of a ladder filter including a plurality of surface acoustic wave resonators. The steepness described in the ordinate of FIG. 7 is represented by values determined by (frequency at which the attenuation is 3.0 dB)–(frequency at which the attenuation is 50 dB).

As shown in FIG. 7, as the resonance Q factor of the surface acoustic wave resonator increases, the steepness at the low-frequency side of the passband of the ladder filter is improved.

Figure 8:
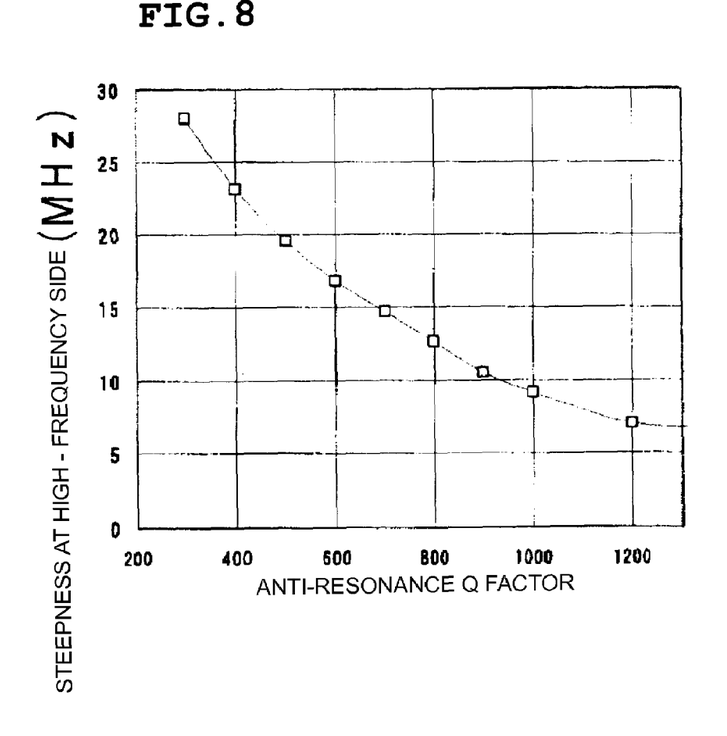
FIG. 8 is a graph showing the relationship between the anti-resonance Q factor of a 1-port surface acoustic wave resonator and the steepness of the filter characteristic at frequencies higher than the passband of a ladder filter.

FIG. 8 is a graph showing the relationship between the anti-resonance Q factor of a surface acoustic wave resonator and the steepness at the high-frequency side of the passband of a ladder filter. The steepness described in the ordinate of FIG. 8 is represented by values determined by the frequency at which the attenuation is 3.0 dB and the frequency at which the attenuation is 40 dB.

As shown in FIG. 8, as the anti-resonance Q factor of the surface acoustic wave resonator increases, the steepness at the high-frequency side of the passband of the ladder filter is improved.

Figure 9:
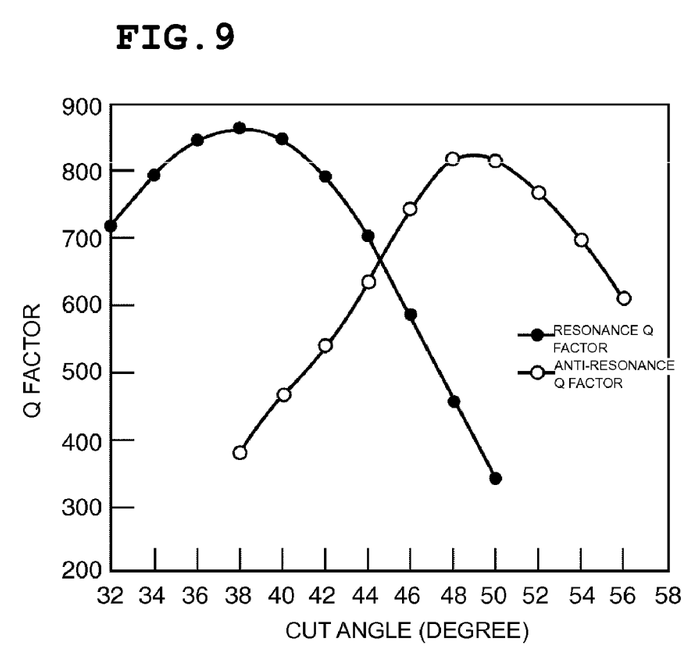
FIG. 9 is a graph showing the relationship between the cut angle of a rotation Y-cut X-propagation $LiTaO_3$ substrate and the resonance Q factor and the relationship between the cut angle and the anti-resonance Q factor.

Consequently, various 1-port surface acoustic wave resonators were prepared using Y-cut X-propagation $LiTaO_3$ substrates having various rotation angles, and the resonance Q factors and the anti-resonance Q factors were determined. The results are shown in FIG. 9. Electrodes defining the surface acoustic wave resonators were made of Cu, and the thickness thereof was about 4.0% of the wavelength (i.e., about 80 nm). The line width of the IDT electrodes was about 0.5 μm, and the wavelength was about 2 μm. Furthermore, a pair of reflectors having the same line width of about 0.5 μm and the same thickness of about 4.0% as those of the electrodes were made of Cu and disposed on both sides of the IDT electrodes in the direction of the propagation of surface acoustic waves. Furthermore, in order to improve the temperature-dependent characteristic, a $SiO_2$ film was disposed so as to cover the electrodes. The thickness of the $SiO_2$ film was about 20% of the wavelength, i.e., about 400 nm.

As shown in FIG. 9, the resonance Q and the anti-resonance Q were changed by varying the cut angle of the 1-port surface acoustic wave resonators. In addition, the results showed that a cut angle that provided a satisfactory resonance Q and a cut angle that provided a satisfactory anti-resonance Q were different. On the other hand, as shown in FIG. 7, the steepness at the low-frequency side of the passband is improved by increasing the resonance Q, and as shown in FIG. 8, the steepness of the filter characteristic at the high-frequency side of the passband is improved by increasing the anti-resonance Q.

Accordingly, in order to increase the steepness of the filter characteristic at the high-frequency side in the first filter having a relatively low passband, the anti-resonance Q of the surface acoustic wave resonator is increased. For this purpose, as shown in FIG. 9, a piezoelectric substrate having a large cut angle is preferably used. In contrast, in order to increase the steepness of the filter characteristic at the filter side in the second filter having a relatively high passband, the resonance Q of the surface acoustic wave resonator is increased. For this purpose, as shown in FIG. 9, a piezoelectric substrate having a small cut angle is preferably used.

Consequently, in the surface acoustic wave branching filter 1 of this preferred embodiment, the first piezoelectric substrate 13 used in the first filter 11 is made of a Y-cut X-propagation LiTaO₃ substrate having a cut angle greater than that of the second piezoelectric substrate 14. Therefore, according to this preferred embodiment, the steepness of the filter characteristic at the high-frequency side of the passband of the first filter and at the low-frequency side of the passband of the second filter 12 is effectively increased.

Previously, as described in Patent Document 1, a transmission-side filter and a reception-side filter have been provided on the same piezoelectric substrate. In such a case, the cut angle of the piezoelectric substrate is inevitably the same. Therefore, in order to increase the resonance Q and the anti-resonance Q, a LiTaO₃ substrate having a cut angle of about 45° has been used. However, in this structure, the steepness at the high-frequency side of the passband of the transmission-side filter and at the low-frequency side of the passband of the reception-side filter cannot be sufficiently increased.

In contrast, in the surface acoustic wave branching filter of the present preferred embodiment, the cut angles of the first piezoelectric substrate 13 and the second piezoelectric substrate 14 are selected as described above. Consequently, the steepness at the stop bands adjacent to the passband of the counterpart in the passbands of the first filter 11 and the second filter 12 are effectively increased.

As shown in FIG. 9, in the rotation Y-cut X-propagation LiTaO₃ substrate, the line of the resonance Q factor and the line of the anti-resonance Q factor of the surface acoustic wave resonator intersect at a cut angle of about 45°. The anti-resonance Q increases at a cut angle of at least about 45°, and the resonance Q increases at a cut angle of less than about 45°. Accordingly, the first piezoelectric substrate 13 is preferably made of a rotation Y-cut X-propagation LiTaO₃ substrate having a cut angle of at least about 45°, and the second piezoelectric substrate 14 is preferably composed of a rotation Y-cut X-propagation LiTaO₃ substrate having a cut angle of less than about 45°.

As described above, in the surface acoustic wave branching filter of this preferred embodiment, the piezoelectric substrates 13 and 14 having different cut angles are used as the first filter 11 having a relatively low passband and the second filter 12 having a relatively high passband, respectively. Thereby, piezoelectric substrates that achieve the optimum anti-resonance Q and the optimum resonance Q can be used for respective filters. Therefore, the steepness of the filter characteristics at the high-frequency side of the passband of the first filter and the low-frequency side of the passband of the second filter 12 is effectively increased.

Figure 10:
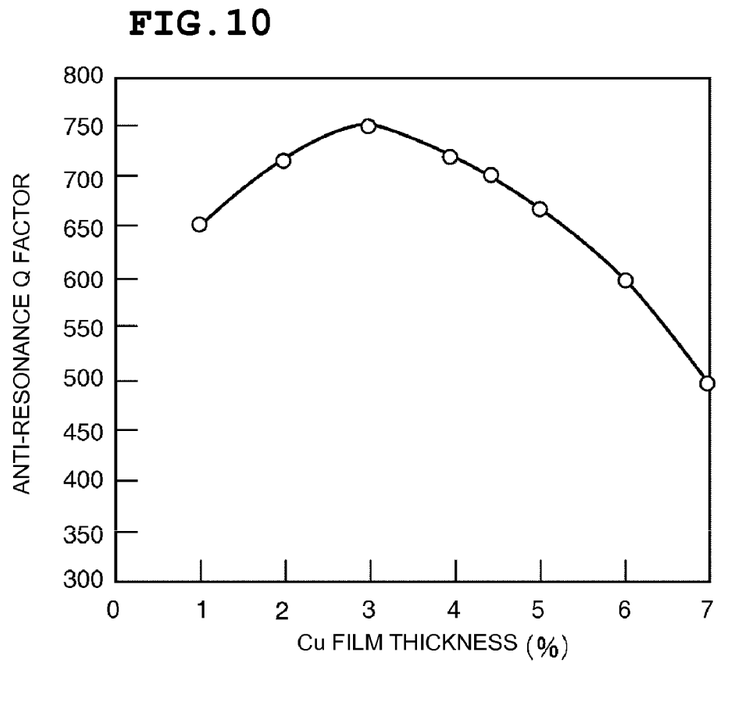
FIG. 10 is a graph showing the relationship between the film thickness of a Cu electrode and the anti-resonance Q factor.
Figure 11:
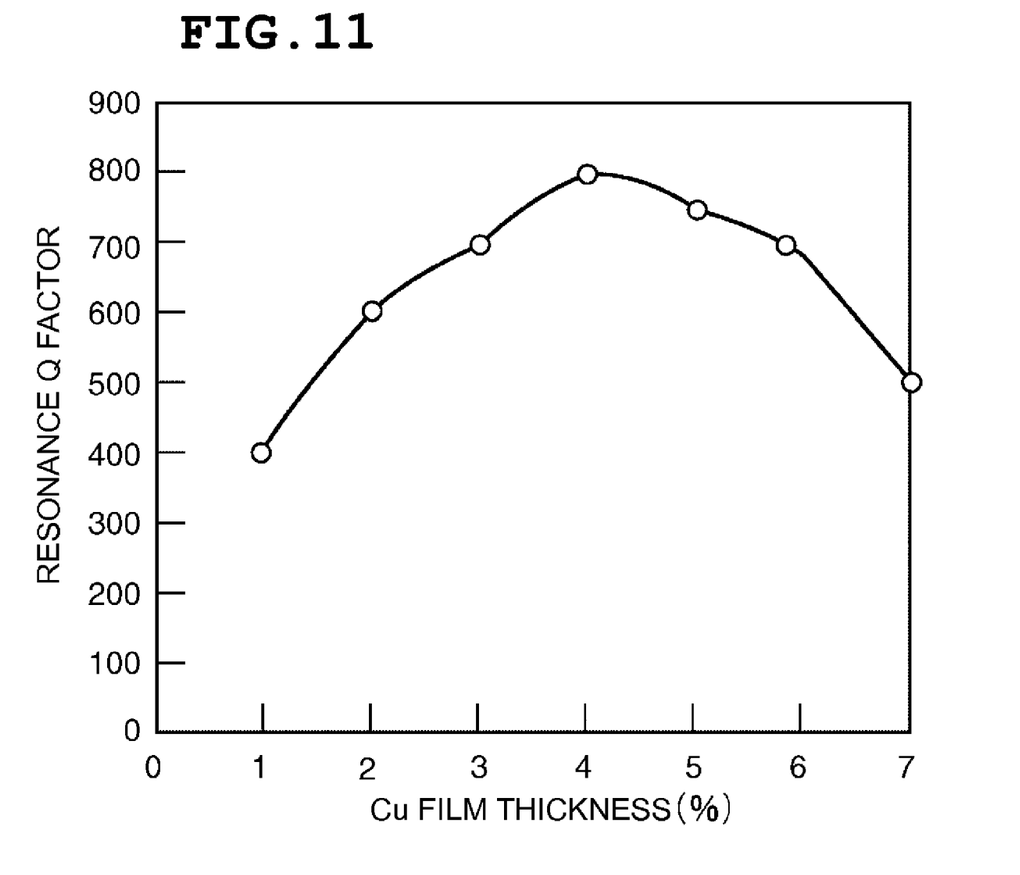
FIG. 11 is a graph showing the relationship between the film thickness of a Cu electrode and the resonance Q factor.

In the above-described preferred embodiment, the IDT electrodes of the surface acoustic wave resonators are preferably made of Cu. The present inventors have found that when the film thickness of the electrode is changed, the resonance Q and the anti-resonance Q of the surface acoustic wave resonator are changed. FIGS. 10 and 11 are graphs showing a change in the anti-resonance Q and a change in the resonance Q of a 1-port surface acoustic wave resonator, respectively, in the case where the film thickness of an electrode made of Cu is changed. In FIG. 10, a rotation Y-cut X-propagation LiTaO₃ substrate having a cut angle of about 42° was used as the piezoelectric substrate. In FIG. 11, a rotation Y-cut X-propagation LiTaO₃ substrate having a cut angle of about 46° was used as the piezoelectric substrate. The structure of the electrode other than the film thickness was the same as that of the above preferred embodiment. The film thickness of the electrode is represented by a ratio (%) of the thickness to the wavelength determined on the basis of the electrode finger period. As shown in FIGS. 10 and 11, the resonance Q and the anti-resonance Q are changed by changing the film thickness of the electrode made of Cu. Referring to FIG. 10, when the film thickness of the electrode is in the range of about 2% to about 4.5% of the wavelength, the anti-resonance Q factor is t least about 700, which is satisfactory. Referring to FIG. 11, when the film thickness of the electrode is in the range of about 3% to about 6% of the wavelength, the resonance Q factor is at least about 700, which is satisfactory.

Accordingly, the results show that when the film thickness of the Cu electrode in the first filter is in the range of about 2% to about 4.5% of the wavelength, and when the film thickness of the Cu electrode in the second filter 12 is in the range of about 3% to about 6%, the resonance Q factor is at least 700, which is a satisfactory value. Consequently, in the first filter 11, the film thickness of the electrode made of Cu is preferably in the range of about 2% to about 4.5% of the wavelength, and in the second filter 12, the film thickness of the electrode made of Cu is preferably in the range of about 3% to about 6% of the wavelength.

FIGS. 10 and 11 show the results of the case where the electrode is made of Cu. Alternatively, in the present invention, the electrode may be composed of a metal other than Cu, for example, a Cu alloy, a metal other than Cu or an alloy thereof, or a laminated metal film prepared by laminating a plurality of metal films. In such cases, the preferred film thickness may be converted from the relationship between the density $\rho$ of the electrode and the density $\rho_{Cu}$ of copper. Specifically, when the average density of the electrode is $\rho$, the preferred range of the film thickness of the electrode in the first filter 11 and the preferred range of the film thickness of the electrode in which the resonance Q is increased in the filter may be determined on the basis of the density of Cu, i.e., $\rho_{Cu}=8.9$ (g/cm³). In equations (1) and (2), $\lambda 1$ and $\lambda 2$ represent wavelengths determined based on the electrode finger period of the electrodes of the first filter and the second filter, respectively, and $\rho 1$ and $\rho 2$ represent densities of the electrodes of the first filter and the second filter, respectively. When the electrode has a multilayer structure including a plurality of metals, or when the electrode is made an alloy or other suitable material, the average density of the entire electrode may be determined and used as the density of the electrode.

Preferred range of film thickness of electrode in first filter=$0.18 \times \lambda 1/\rho 1$ to $0.40 \times \lambda 1/\rho 1$      Equation (1)

Preferred range of film thickness of electrode in second filter=$0.27 \times \lambda 2/\rho 2$ to $0.53 \times \lambda 2/\rho 2$      Equation (2)

The surface acoustic wave device according to preferred embodiments of the present invention can be used not only for a duplexer for PCS, but also for various branching filters and duplexers.

The piezoelectric substrate is not limited to a LiTaO₃ substrate, and other piezoelectric single-crystal substrates such as a LiNbO₃ substrate may also be used.

While preferred embodiments of the present invention have been described above, it is to be understood that variations and modifications will be apparent to those skilled in the art without departing the scope and spirit of the present invention. The scope of the present invention, therefore, is to be determined solely by the following claims.

What is claimed is:

1. A surface acoustic wave device comprising:
a first filter including a plurality of surface acoustic wave resonators that are connected in a ladder circuit configuration on a first piezoelectric substrate, and a frequency range of the passband of the first filter is relatively low; and
a second filter including a plurality of surface acoustic wave resonators that are connected so as to have a ladder circuit configuration on a second piezoelectric substrate, and a frequency range of the passband of the second filter is relatively high; wherein
the first piezoelectric substrate and the second piezoelectric substrate are rotation Y-cut X-propagation $LiTaO_3$ substrates; and
a cut angle of the first piezoelectric substrate is greater than a cut angle of the second piezoelectric substrate.

2. The surface acoustic wave device according to claim 1, wherein the first piezoelectric substrate comprises a rotation Y-cut X-propagation $LiTaO_3$ substrate having a cut angle of at least about 45°, and the second piezoelectric substrate comprises a rotation Y-cut X-propagation $LiTaO_3$ substrate having a cut angle of less than about 45°.

3. The surface acoustic wave device according to claim 1, wherein the first and second filters comprise first and second electrodes that are provided on the first and second piezoelectric substrates, respectively, to define the first and second filters; and
when the densities of the first and second electrodes are represented by $\rho1$ and $\rho2$ (g/cm$^3$), respectively, and the wavelengths measured on the basis of the electrode finger period of the electrodes of the first and second filters are represented by $\lambda1$ and $\lambda2$ (μm), respectively, a film thickness of the first electrode is in the range of about $0.18\times\lambda1/\rho1$ to about $0.40\times\lambda1/\rho1$, and a film thickness of the second electrode is in the range of about $0.27\lambda2/\rho2$ to about $0.53\times\lambda2/\rho2$, wherein $\lambda1$ and $\lambda2$ represent wavelengths determined based on an electrode finger period of the electrodes of the first filter and the second filter.

4. The surface acoustic wave device according to claim 3, wherein the first electrode and the second electrode are comprised of Cu, the thickness of the first electrode is in the range of about $0.02\lambda1$ to about $0.045\lambda1$, and the thickness of the second electrode is in the range of about $0.03\lambda2$ to about $0.06\lambda2$.

5. The surface acoustic wave device according to claim 1, further comprising a $SiO_2$ film provided on each of the first piezoelectric substrate and the second piezoelectric substrate and arranged to improve the temperature-dependent characteristics.

6. The surface acoustic wave device according to claim 5, wherein the thickness of the $SiO_2$ film is in the range of about 5% to about 50% of the wavelengths of the first filter and the second filter.

7. The surface acoustic wave device according to claim 5, wherein an upper surface of the $SiO_2$ film is planarized.

8. The surface acoustic wave device according to claim 1, wherein the surface acoustic wave device is a duplexer.

* * * * *